United States Patent [19]
Nork

[11] Patent Number: 6,163,494
[45] Date of Patent: Dec. 19, 2000

[54] IC WITH ENHANCED LOW VOLTAGE START-UP

[75] Inventor: Samuel H. Nork, Andover, Mass.

[73] Assignee: Linear Technology Corporation, Milpitas, Calif.

[21] Appl. No.: 09/240,102

[22] Filed: Jan. 29, 1999

[51] Int. Cl.[7] .................................................. G11C 11/40
[52] U.S. Cl. ........................................ 365/226; 365/227
[58] Field of Search ................................. 365/226, 227, 365/51, 63

[56] References Cited

U.S. PATENT DOCUMENTS

| | | | |
|---|---|---|---|
| 5,216,588 | 6/1993 | Bajwa et al. | 365/226 |
| 5,623,224 | 4/1997 | Yamada et al. | 365/226 |
| 5,659,519 | 8/1997 | Lee et al. | 365/226 |

Primary Examiner—Terrell W. Fears
Attorney, Agent, or Firm—Fish & Neave; Robert W. Morris; Stephen T. Straub

[57] ABSTRACT

The present invention enables efficient start-up of integrated circuit at low voltages. The present invention disconnects the output load from the circuit by placing the circuit connected to the output load into a high impedance state. Thus, the internal voltage of the circuit can be boosted before it is subject to drain from an external load. A comparator is connected to the circuit placed in the high impedance state and determines when the internal voltage has reached a sufficient level so that the effect of the external load on the efficient operation of the circuit will be minimized.

19 Claims, 5 Drawing Sheets

IC WITH ENHANCED LOW VOLTAGE START-UP

BACKGROUND OF THE INVENTION

This invention relates to implementing a low voltage start-up function for an integrated circuit (IC). A preferred embodiment of the invention is described for a direct current to direct current (DC-DC) conversion circuit with a low input voltage and an output load. However, persons skilled in the art will appreciate that the present invention can be applied to other ICs as well.

The present invention enables the internal voltage of the circuit to be increased without the negative effect of an external load draining that voltage before it can build to a sustainable level. The increased internal voltage also serves to reduce the on-resistance of the IC. The invention also enables this low voltage start-up function without adding a dedicated external control pin.

Step-up DC-DC conversion circuits can be implemented in an inductor based topology or in a switched capacitor based topology (e.g., a charge pump). The inductor based topology is generally preferred for low input voltage applications because it has greater package efficiency and start-up capability than the capacitor based topology. For example, a conversion circuit that boosts the input voltage four times (a quadrupler) can be implemented in the inductor based topology with a minimum of three pins while the capacitor based topology requires at least eight pins. The inductor based topology also requires less power switches to implement a quadrupler than the capacitor based topology. Thus, the inductor based topology has a lower on-resistance since it has less power switches and, therefore, it provides advantages for low voltage applications.

The inductor based topology, however, also has some disadvantages compared to the capacitor based topology. For instance, an inductor based topology is more complex to design than a capacitor based topology because the former requires numerous external components in addition to the internal IC controls. Moreover, inductor based topologies require magnetic energy storage which is difficult to stabilize and radiates EMI waves.

Inductor and capacitor based topologies do not provide adequate switch drive capability necessary for the low on-resistance required for an IC to operate at low input voltages. For instance, a quadrupler charge pump based on the capacitor topology requires a minimum of eight power switches and eight external pins. Such a capacitor based topology is difficult to start-up at low input voltages because of the high on-resistance of the power switches. Generally, capacitor based topology charge pumps have a higher on-resistance than inductor based topology charge pumps because of the extra power switches necessary to implement a charge pump based on a capacitor topology (eight switches versus one switch in the quadrupler discussed above). The resistive drops in the power switches caused by the inadequate drive voltage are effectively multiplied in the capacitor based topology by the additional power switches.

The addition of an external load creates another issue for the IC because the internal voltage needed to drive the power switches is drained across the external load before it can build to a sustainable level. Therefore, it is desirable to provide a switched capacitor based DC-DC converter that can enable low voltage start-up, operate at very low input voltages, and will not require extra control pins.

The present invention can be applied to any IC where the internal bias voltage is drained across an external load during start-up. The load drain in these circuits exacerbates the inefficiencies caused by the on-resistance of the circuit.

SUMMARY OF THE INVENTION

The enhanced start-up capability is provided by isolating the internal bias voltage from the external load while the voltage level is increased. In a preferred embodiment of the invention, the internal bias voltage is shielded from the output load by a high impedance circuit so that it is not discharged across the output load as the IC is attempting to build up that voltage. The shielding circuit is controlled by a comparator which ensures that an internal voltage has reached a selected level before the internal voltage is placed across the load.

The present invention is described below as it is implemented in a quadrupler charge pump circuit. In a quadrupler charge pump comprised of two charge pumps (doublers), the comparator is preferably located between the first and second charge pumps and switches the second charge pump from the OFF state (high impedance) to the ON state when the output voltage from the first charge pump reaches a level sufficiently greater than the voltage input to that first charge pump, e.g., 1.5 volts for a 1 volt input.

However, one of skill in the art will appreciate that the invention could be implemented in a sextupler or octupler charge pump circuit. In those circuits, the present invention could be located anywhere along the chain of charge pumps, but would preferably be coupled to the last doubler in the chain, i.e., the one connected to the load, so that the internal bias voltage can be increased as the input voltage is stepped-up across the prior charge pumps (doublers). One skilled in the art would also appreciate that the present invention could be used in a positive to negative converter circuit or any circuit that experiences low voltage start-up problems due to external load drain.

As discussed above, a low input voltage to a step-up DC-DC converter presents a problem because there initially is not enough voltage drive on the power switches to overcome their on-resistance. When a low input voltage is used, the drive voltage is small and the on-resistance of the circuit is large, so power is lost at each switch and the circuit does not operate effectively. To minimize the power lost, the internal voltage level must be boosted to adequately drive the transistors and minimize their on-resistance so that less power is lost at each switch. As the on-resistance becomes lower, the switches operate more efficiently and less power is lost as the signal transverses the circuit.

The internal voltage level, however, cannot be boosted in a timely manner if that voltage is discharged across an external load before it has a chance to build to a level sufficient to drive the gates and lower their on-resistance. Therefore, one of the objects of this invention is to provide low voltage start-up capability for ICs connected to an external load.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout.

DETAILED DESCRIPTION OF THE INVENTION

Figure 1:
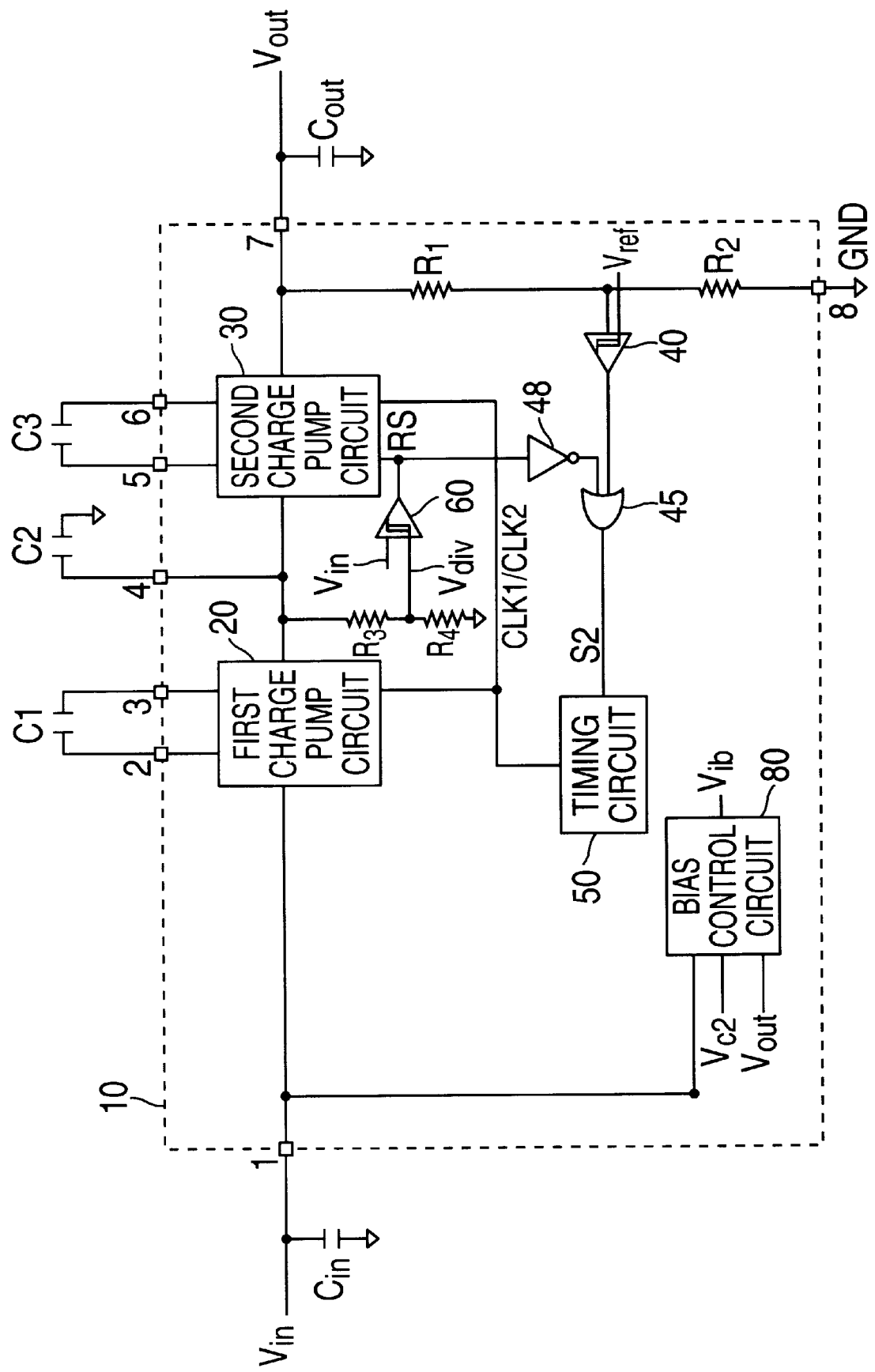
FIG. 1 is a block diagram of a quadrupler charge pump circuit according to the present invention.

FIG. 1 shows a block diagram of quadrupler charge pump circuit 10 with eight terminal pins 1–8, which are coupled to input voltage $V_{in}$, output voltage $V_{out}$, five external capacitors C1, C2, C3, $C_{in}$ and $C_{out}$, and ground GND.

Quadrupler charge pump circuit 10 comprises first charge pump circuit 20, second charge pump circuit 30, first comparator circuit 40, timing circuit 50, second comparator circuit 60, and bias control circuit 80. The general operation of circuit 10, including the operation of first and second charge pump circuits 20 and 30 (shown in FIGS. 3, 4A and 4B), first comparator 40 and bias control circuit 80, are described in U.S. Patent Application No. 09/240,261; entitled "Control Feature For IC Without Using Dedicated Pin", filed concurrently with the present application, which herein is incorporated by reference in its entirety. One skilled in the art can appreciate that the sampling circuit described therein can be added to this circuit, but is not necessary for its operation.

Generally, voltage $V_{in}$ is input to first charge pump circuit 20, which outputs a voltage approximately two times $V_{in}$ and stores that voltage on capacitor C2 as voltage $V_{C2}$. If voltage $V_{C2}$ is not larger than voltage $V_{in}$ by a preselected margin, then second charge pump circuit 30 is placed in a high impedance state until voltage $V_{C2}$ becomes sufficiently larger than voltage $V_{in}$. Once second charge pump circuit 30 is enabled, voltage $V_{C2}$ is input to second charge pump circuit 30 that, in turn, outputs voltage $V_{out}$, which is approximately two times voltage $V_{C2}$. Thus, output voltage $V_{out}$ is approximately four times input voltage $V_{in}$ under steady state operating conditions.

Voltage $V_{ib}$ is generated from bias control circuit 80 which selects the highest voltage from the input voltage $V_{in}$, voltage $V_{c2}$, and output voltage $V_{out}$. Thus, internal bias voltage used to drive the power switches and lower the on-resistance of the circuit is maintained at the highest possible level. During low voltage start up, voltage $V_{in}$ is the highest voltage because both voltages $V_{C2}$ and $V_{out}$ are approximately zero volts. Since voltage $V_{in}$ is low, it does not provide the necessary drive voltage to lower the on-resistance of the power switches, therefore, a lot of power is lost as the signal progresses through circuit 10 until the internal voltage $V_{ib}$ is high enough to adequately drive the power switches in first and second charge pump circuits 20 and 30.

Further, because power is lost in the switches and $V_{out}$ is connected to a load, neither $V_{C2}$ nor $V_{out}$ can be boosted by the charge pumps and the internal bias voltage remain low thus preventing quadrupler charge pump circuit 10 from operating efficiently. To solve the problem of low voltage start up, second charge pump circuit 30 is placed in a high impedance state (open circuit) so that the output load does not drain the internal bias voltage before it can be boosted to a sustainable level necessary to drive the circuit's power switches. Voltage $V_{C2}$ is raised by first charge pump circuit 20 to a level high enough (higher than $V_{in}$ as measured by second comparator 60) to provide an effective drive voltage and to minimize the effect of the external load.

While second charge pump circuit 30 is in a high impedance state (e.g., has a high impedance input), first charge pump circuit 20 boosts voltage $V_{C2}$. Voltage $V_{C2}$ is divided across resistors R3 and R4 and compared to input voltage $V_{in}$ as divided voltage $V_{div}$ at second comparator 60 to generate signal RS. The ratio of R3 to R4 determines what level voltage $V_{C2}$ must reach before second charge pump circuit 30 is enabled. The ratio of R3 to R4 is a design choice, which in the preferred embodiment is about 0.5 to 1 (or 1:2), based on such factors as the gate drive level of voltage $V_{C2}$ and the start up time. Thus, voltage $V_{C2}$ will reach a level sufficiently higher (based on the selected level of voltage $V_{div}$) than voltage $V_{in}$ before second charge pump circuit 30 is turned ON (i.e., removed from its high impedance state) by second comparator 60. Voltage $V_{C2}$ is coupled to voltage $V_{out}$, which is placed across the external load when second charge pump circuit 30 is turned ON.

Figure 2:
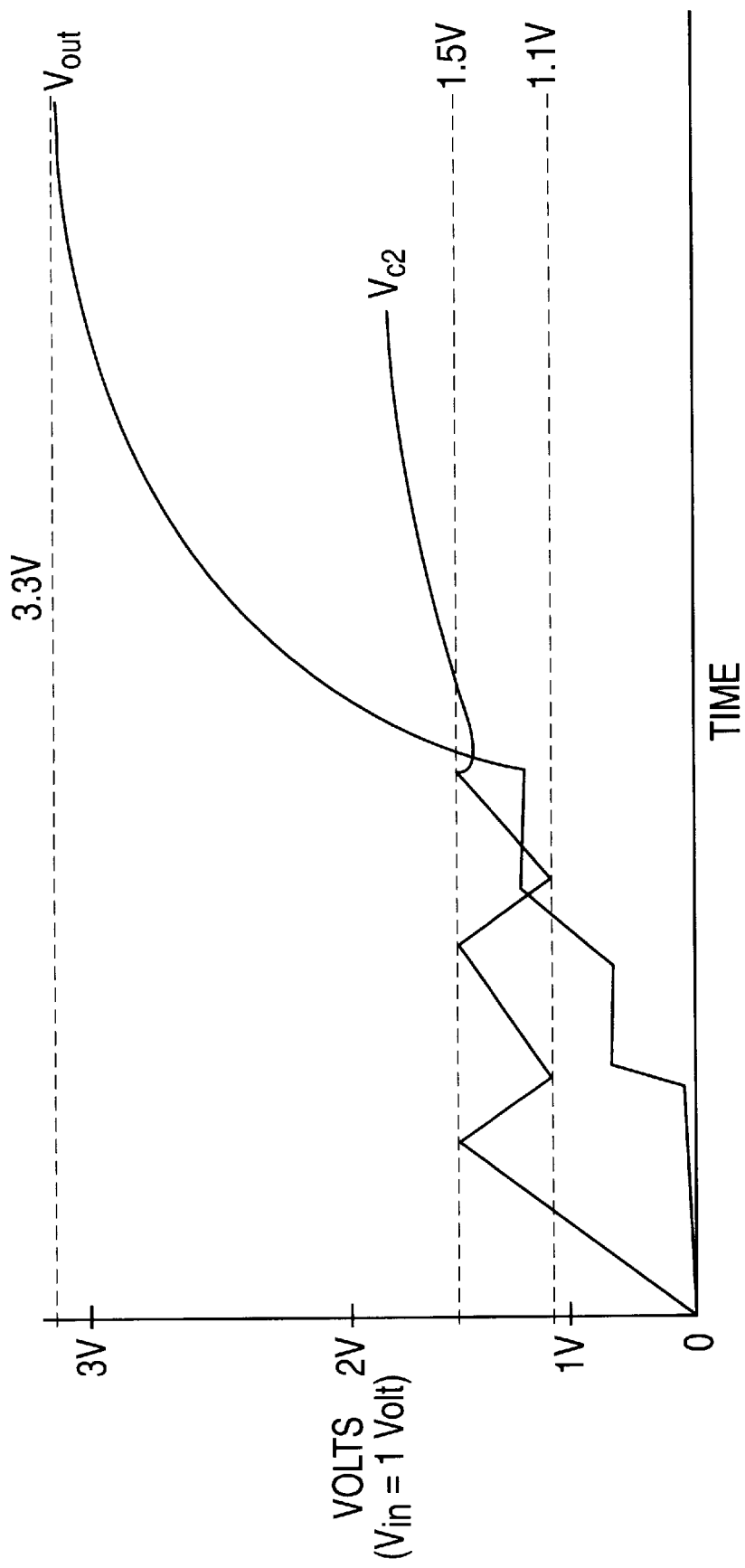
FIG. 2 is a graph of the effect of hysteresis in the second comparator of FIG. 1.

FIG. 2 is a graph plotting voltage $V_{C2}$ and voltage $V_{out}$ versus time from the start up of circuit 10 and demonstrates the use of hysteresis in second comparator 60. The plot is based on a voltage $V_{in}$ of 1 volt and values of resistors R3 and R4 selected so that second charge pump 30 is turned ON when voltage $V_{C2}$ reaches 1.5 volts. When voltage $V_{C2}$ reaches 1.5 volts, second charge pump 30 is removed from the high impedance state (turned ON) so that voltage $V_{C2}$ is coupled to voltage $V_{out}$. Voltage $V_{C2}$ is, thus, drained across the external load and droops from its 1.5 volt level. Because of the hysteresis in second comparator 60, second charge pump 30 is not placed back into its high impedance state (turned OFF) until voltage $V_{C2}$ droops to 1.1 volts. During this time, voltage $V_{out}$ was built up to a level less than 1 volt.

When voltage $V_{C2}$ is again boosted to 1.5 volts, second charge pump 30 is again turned ON, voltage $V_{C2}$ is coupled to voltage $V_{out}$ and it is drained across the external load. This process continues until voltage $V_{C2}$ and voltage $V_{out}$ are high enough so that voltage $V_{C2}$ does not droop to 1.1 volts. The hysteresis level of second comparator 60 can be selected as a design parameter of the circuit (e.g., 400 mV).

Returning to circuit 10 of FIG. 1, timing circuit 50 is comprised of any circuit which can generate two non-overlapping clock signals, CLK1 and CLK2. The non-overlapping clock signals are needed to control first and second charge pump circuits to ensure that no large shoot through current develops. If the invention is used in a circuit other than a charge pump, a different clock signal can be used. The type of clock signal necessary for the operation of a circuit is based on design considerations.

When circuit 10 is turned ON, signal RS is LOW because voltage $V_{C2}$ is less than voltage $V_{in}$. Two things occur when signal RS is LOW. Second charge pump circuit 30 is placed into a high impedance state by the output of second comparator 60, i.e., signal RS. And, timing circuit 50 is controlled by the output of OR gate 45 via signal RS, which is fed through inverter 48 to achieve the correct polarity. Thus, timing circuit 50 will continue to generate signals CLK1 and CLK2 and first charge pump circuit 20 will continue to function.

At the start-up of circuit 10 $V_{out}$ is disconnected from the rest of the IC because second charge pump circuit 30 is in a high impedance state; thus, the output of first comparator 40 is unknown. The unknown output of first comparator 40 might cause the shutdown of timing circuit 50, which would cause the complete shut down of circuit 10. OR gate 45 enables the operation of timing circuit 50 to be controlled by either signal RS or by the output from first comparator 40.

Therefore, when signal RS is LOW and second charge pump 30 is in a high impedance state, timing circuit 50 is controlled by signal RS via inverter 48 and OR gate 45, to ensure that signals CLK1 and CLK2 are generated. Thus, signal RS keeps the internal clock running while second charge pump circuit 30 is in a high impedance state. The mechanism for use of multiple control signals to enable timing circuit 50 can be implemented in any manner known to one of skill in the art.

Once signal RS goes HIGH, second charge pump circuit 30 will be enabled and the operation of timing circuit 50 will be controlled by the output of first comparator 40.

Figure 3:
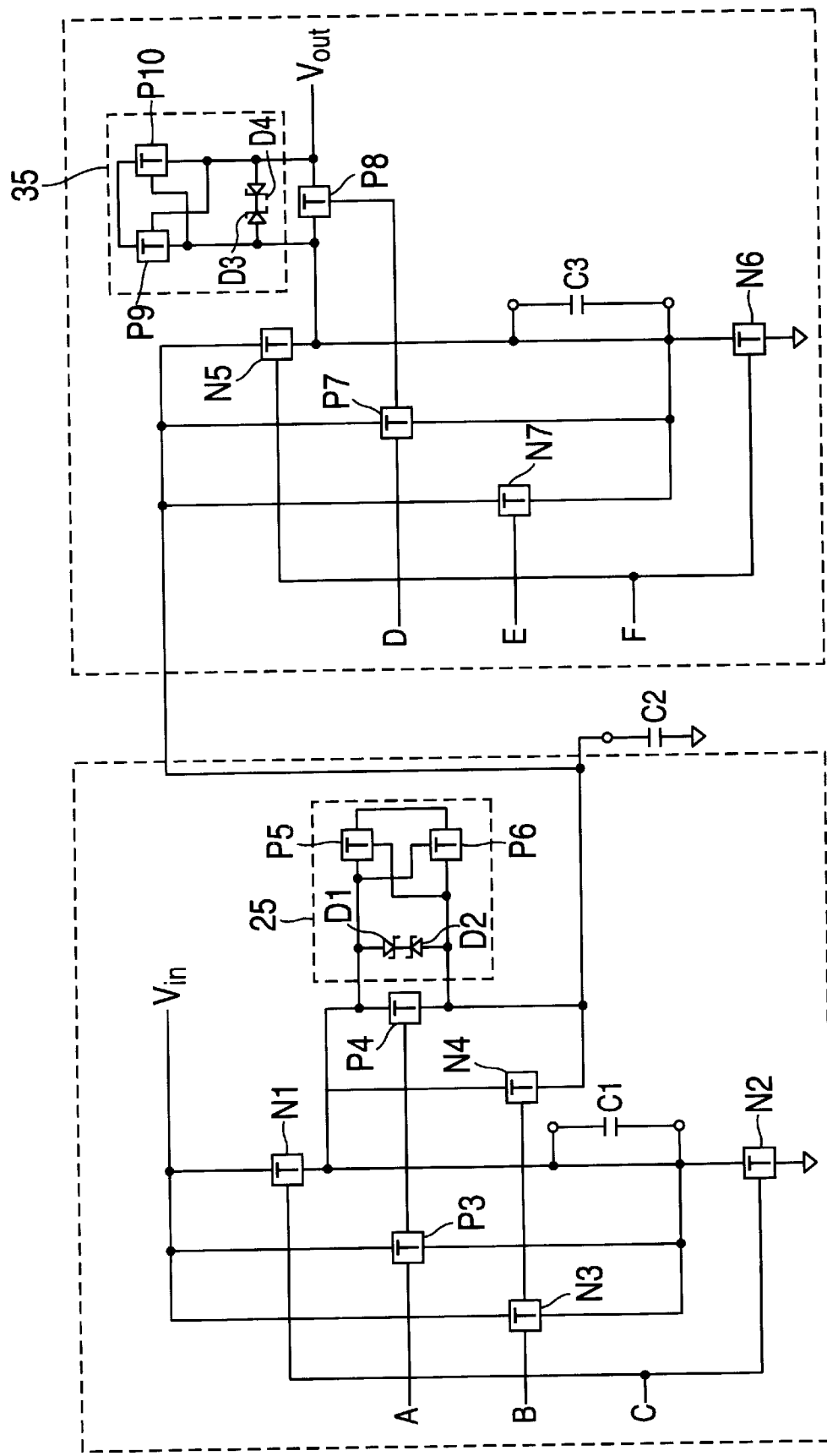
FIG. 3 is a circuit diagram of the doubler circuits in the charge pumps of FIG. 1.

First doubler 22 and second doubler 32, shown in FIG. 3, operate in the same manner described in U.S. Patent Application No. 09/240,261 (incorporated by reference above). The control signals are generated in a slightly different manner, as described below with respect to FIGS. 4A and 4B.

Figure 4A:
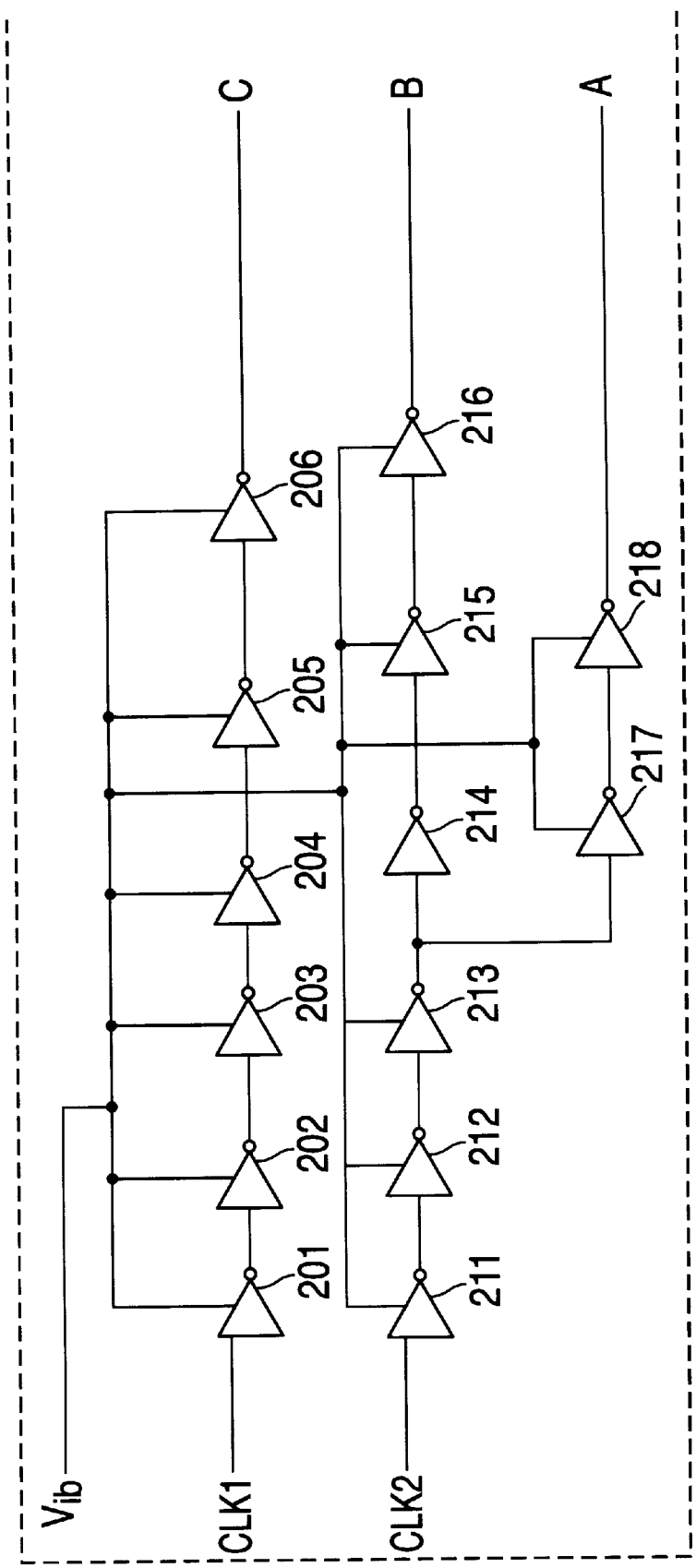
FIGS. 4A and 4B are circuit diagrams of the series of logic gates in the charge pump circuits of FIG. 1, which are used to generate the control signals for the doublers of FIG. 3.

As shown in FIG. 4A, the series of logic gates 201 to 218 are used to generate control signals A, B, and C for first doubler 22. No override signal (see e.g., FIG. 4B) is provided for the logic gates shown in FIG. 4A. Instead, signals A, B, and C are generated based on clock signals CLK1 and CLK2. Signal C is HIGH when signal CLK1 is HIGH. Signal B is HIGH and signal A is LOW when signal CLK2 is HIGH. Transistors N1 and N2 (see FIG. 3) are turned ON when signal CLK1 pulses HIGH so that voltage $V_{in}$ is stored on capacitor C1. Transistors N3, N4 and P3, P4 (see FIG. 3) are turned ON when signal CLK2 pulses HIGH so that voltage $V_{C1}$ is summed with voltage $V_{in}$.

Figure 4B:
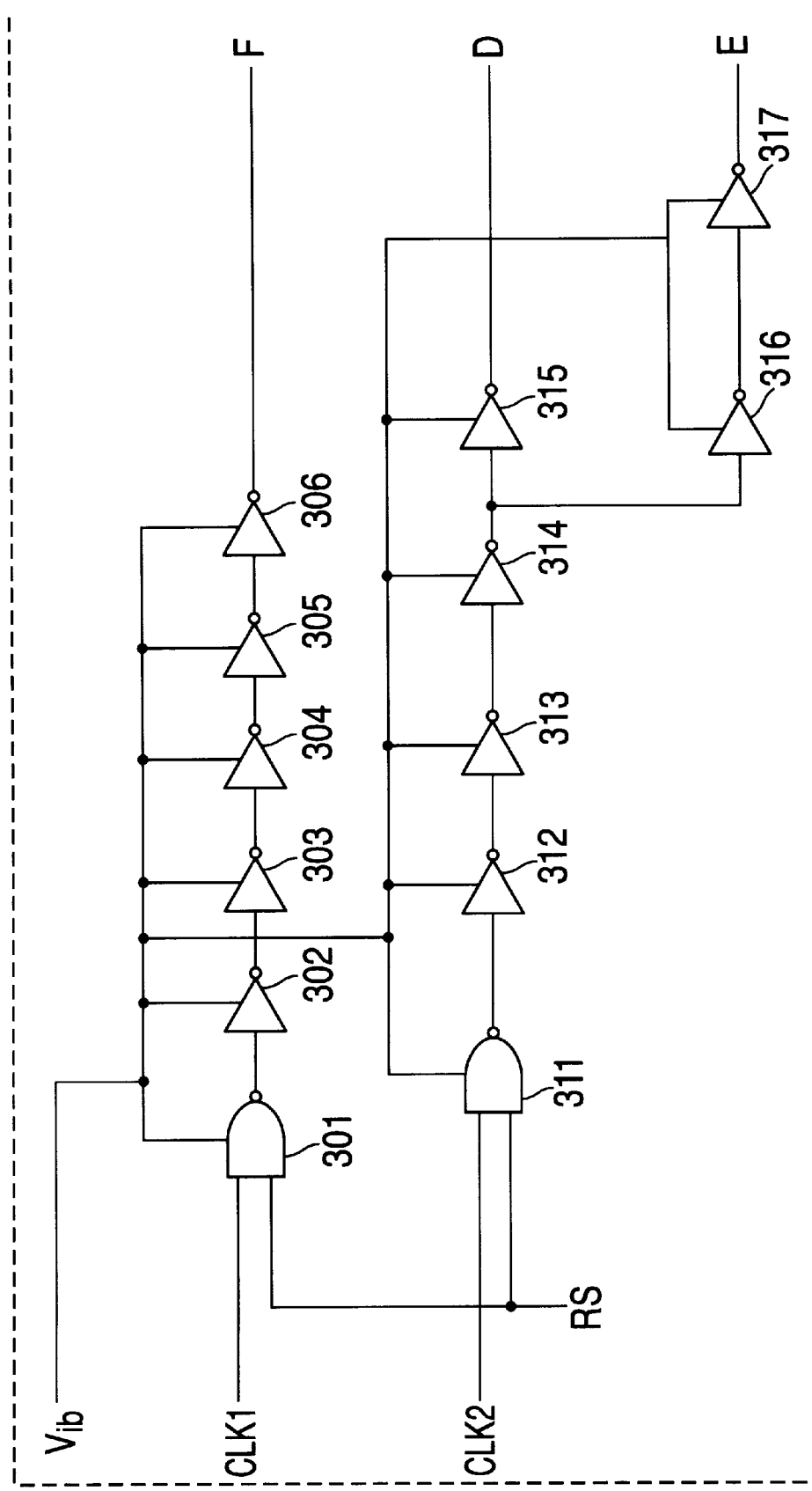

As shown in FIG. 4B, signal RS acts as an override signal when it is LOW by forcing all of the transistors in second doubler 32 of FIG. 3 OFF, which places second charge pump circuit 30 into a high impedance state. When signal RS is HIGH, signals D, E, and F are generated based on clock signals CLK1 and CLK2. Signal F is HIGH when signal CLK1 is HIGH and signal RS is HIGH. Signal E is HIGH and signal D is LOW when signal CLK2 is HIGH and signal RS is HIGH. Thus, voltage $V_{C2}$ is stored on capacitor C3 during CLK1 and voltage $V_{C3}$ and voltage $V_{C2}$ are summed during CLK2 to effectively double the voltage input to second charge pump circuit 30 when signal RS is HIGH.

Transistors labeled by "N" are preferably implemented as n-channel transistors and those labeled "P" are preferably implemented as p-channel transistors.

The invertor chains in FIGS. 4A and 4B serve to increase the drive for the power switches in the first and second charge pump circuits of FIG. 3. These invertors may preferably increase in size from left to right. The invertors of FIG. 4A may be larger than those of FIG. 4B because the transistors in second charge pump circuit 30 usually do not require the same switching power as those in first charge pump circuit 20. However, the size and dimensions of the invertors depends on design choices, such as the type of transistors selected (preferably MOSFET transistors), and other factors which vary according to circuit design.

In circuits with more than two charge pumps, the voltage input to the comparator can be compared to the voltage input to the integrated circuit, as described above, or to a voltage input to one of the charge pump circuits along the chain. The selection of voltages to compare is a design choice, however, the voltage input to the comparator is preferably compared to the voltage input to the integrated circuit. The same options apply to other circuits, such as a positive to negative converter circuit, to which the invention can be applied.

By disconnecting the internal voltage from the output load, the internal bias voltage of circuit 10 can be built up without being drained across the external load. Thus, efficient low voltage start-up can be implemented for circuits with an external load and power loss due to on-resistance. Persons skilled in the art will appreciate that the present invention can be practiced by others than the described embodiments, which are presented for purposes of illustration and not of limitation, and the present invention is limited only by the following claims.

I claim:

1. An integrated circuit with enhanced low voltage start-up, comprising:
    a first circuit receiving a first voltage and providing a second voltage;
    a second circuit coupled to the first circuit, the second circuit having ON and OFF states; and
    a comparator coupled between the first and second circuit, wherein the second circuit is placed in the ON state from the OFF state based on the output of the comparator.

2. The circuit according to claim 1, wherein the second circuit has a high impedance input when in the OFF state.

3. The circuit according to claim 1, wherein the first and second circuits are charge pump circuits.

4. The circuit according to claim 1, wherein the comparator receives a third voltage and compares the second voltage received from the first circuit to the third voltage.

5. The circuit according to claim 4, wherein the second voltage is divided across resistors before being compared to the third voltage by the comparator.

6. The integrated circuit according to claim 4, wherein the third voltage is a voltage input to the integrated circuit.

7. The circuit according to claim 4, wherein the third voltage is the first voltage.

8. The circuit according to claim 1, further comprising a clock generator circuit having an output coupled to the first and second circuits.

9. The circuit according to claim 8, wherein the output of the comparator is coupled to the clock generator circuit to ensure that the clock generator circuit provides a clock signal to at least the first circuit while the second circuit is in the OFF state.

10. An integrated circuit with enhanced low voltage start-up, comprising:
    a first circuit receiving a first voltage and providing a second voltage;
    a second circuit coupled to the first circuit for receiving the second voltage; and
    a comparator coupled between the first circuit and the second circuit, the comparator receiving a third voltage and enabling the second circuit when the second voltage exceeds the third voltage by a selected margin, whereby the second circuit is in an OFF state until enabled by the comparator so that the second voltage can be increased even when a voltage input to the integrated circuit is low.

11. The circuit according to claim 10, wherein the second circuit has a high impedance input when in the OFF state.

12. The circuit according to claim 10, wherein the first and second circuits are charge pump circuits.

13. The circuit according to claim 10, wherein the second voltage is divided across resistors before being compared to the third voltage.

14. The integrated circuit according to claim 10, wherein the third voltage is a voltage input to the integrated circuit.

15. The integrated circuit according to claim 10, wherein the third voltage is the first voltage.

16. The circuit according to cl aim 10, further comprising a clock generator circuit coupled to the first an d second circuit.

17. The circuit according to claim 16, wherein the output of the comparator also functions to ensure that the clock generator circuit provides a clock signal to at least the first circuit while the second circuit is disabled.

18. An integrated circuit having an enhanced low voltage start-up feature comprising:
- a quadrupler charge pump circuit including a first doubler circuit and a second doubler circuit,
- the first doubler circuit receiving a first voltage and outputting a second voltage;
- the second doubler circuit coupled to the first doubler circuit for receiving the second voltage and having an ON state and an OFF state;
- a storage capacitor coupled between the first and second doubler circuits, the storage capacitor storing the second voltage output from the first doubler circuit; and
- a comparator circuit coupled to the storage capacitor via a voltage divider that provides a divided voltage, and to the second doubler circuit, the comparator circuit compares the first voltage with the divided voltage and sets the second doubler circuit from the OFF state to the ON state when the divided voltage is greater than the first voltage, whereby having the second doubler in the OFF state enables the voltage stored on the storage capacitor to be increased without being drained by an external load when a voltage input to the integrated circuit is low, thus enabling the quadrupler charge pump to start up with a low input voltage.

19. An integrated circuit having an enhanced low voltage start-up feature comprising:
- a quadrupler charge pump circuit including a first doubler circuit and a second doubler circuit,
- a first doubler circuit receiving a voltage input to the integrated circuit and outputting a second voltage;
- a second doubler circuit coupled to the first doubler circuit for receiving the second voltage, and having an ON state and an OFF state;
- a storage capacitor coupled to an output of the first doubler circuit and to a first input of the second doubler circuit, the capacitor storing the second voltage; and
- a comparator circuit coupled to the output of the first doubler circuit, the storage capacitor, and a second input of the second doubler circuit, the comparator circuit setting the second doubler circuit from an OFF state to an ON state when the stored second voltage of the storage capacitor is sufficiently larger than the input voltage, whereby having the second doubler in the OFF state enables the second voltage stored on the capacitor to be increased without being drained by an external load when the input voltage is low, thus start-up of the quadrupler charge pump with a low input voltage is enabled.

* * * * *